United States Patent
Greither

(10) Patent No.: US 8,928,185 B2
(45) Date of Patent: Jan. 6, 2015

(54) ALTERNATING CURRENT (AC) LEAKAGE CURRENT REDUCTION CIRCUIT

(75) Inventor: Markus Greither, Augsburg (DE)

(73) Assignee: HS Elektronik Systems GmbH, Nordlingen (DE)

(*) Notice: Subject to any disclaimer, the term of this patent is extended or adjusted under 35 U.S.C. 154(b) by 669 days.

(21) Appl. No.: 13/216,794

(22) Filed: Aug. 24, 2011

(65) Prior Publication Data

US 2012/0049935 A1 Mar. 1, 2012

(30) Foreign Application Priority Data

Aug. 24, 2010 (DE) .......................... 10 2010 035 278

(51) Int. Cl.
*H01H 19/64* (2006.01)
*H03K 17/687* (2006.01)
(52) U.S. Cl.
CPC .... *H03K 17/6871* (2013.01); *H03K 2217/0036* (2013.01)
USPC .......................................................... 307/113

(58) Field of Classification Search
CPC ................... H03K 2217/0036; H03K 19/0944; H03K 2017/066; H03K 17/681
USPC ........................................................... 307/113
See application file for complete search history.

(56) References Cited

U.S. PATENT DOCUMENTS

| | | | |
|---|---|---|---|
| 2001/0040479 A1* | 11/2001 | Zhang | 327/427 |
| 2005/0110349 A1* | 5/2005 | Bertrand | 307/112 |
| 2006/0199563 A1* | 9/2006 | Kelly et al. | 455/333 |
| 2013/0154391 A1* | 6/2013 | Urciuoli | 307/112 |

\* cited by examiner

*Primary Examiner* — Daniel Cavallari
(74) *Attorney, Agent, or Firm* — Kinney & Lange, P.A.

(57) ABSTRACT

A solid-state power distribution system having a first solid-state switching device (SSSD) and a second solid-state switching device (SSSD) for distributing power from an AC power source to a load includes a leakage current reduction circuit for reducing leakage current generated by the SSSDs when Off. When the first and second SSSDs are Off, the leakage current reduction circuit provides a positive bias voltage across controlled terminals of the first SSSD and a negative bias voltage across controlled terminals of the second SSSD.

8 Claims, 2 Drawing Sheets

US 8,928,185 B2

ALTERNATING CURRENT (AC) LEAKAGE CURRENT REDUCTION CIRCUIT

CROSS-REFERENCE TO RELATED APPLICATION(S)

This application claims priority to DE patent application No. 10 2010 035 278.0, entitled "ALTERNATING CURRENT (AC) LEAKAGE CURRENT REDUCTION CIRCUIT," filed on Aug. 24, 2010 by Markus Greither.

BACKGROUND

The present invention is related to solid-state switching devices for distributing alternating current (AC) power, and in particular to leakage reduction circuits for minimizing AC leakage current in solid-state switching devices.

Solid-state AC switches are commonly used in place of mechanical relays to distribute power from a source to a load. Solid-state AC switches typically include a pair of solid-state switching devices (SSSDs) connected in series with one another. Each SSSD includes a control terminal and at least two controlled terminals. A control signal provided to the control terminal dictates whether the SSSD is On or Off. When the SSSD is On, the device allows power provided at a first controlled terminal to be supplied to a second controlled terminal. When the SSSD is Off, the device prevents power provided at a first controlled terminal from being supplied to a second controlled terminal. However, most SSSDs are unidirectional, meaning that they allow current to flow in one direction even when Off. For this reason, a solid-state AC switch requires a pair of solid-state switching devices connected in a back-to-back configuration to block both the positive half-cycle and negative half-cycle of the AC input power.

Leakage current is the result of some current being allowed to flow even when both of the series-connected SSSDs are Off. This is a result of parasitic capacitances associated with each SSSD that charge/discharge during the half-cycles of the AC waveform. For example, the junction capacitance associated with the SSSDs allow energy to be stored during a half-cycle of the AC waveform, and as the AC voltage decreases toward the zero crossing, the junction capacitance is discharged, resulting in undesirable leakage current flowing through the SSSD.

SUMMARY

A solid-state power distribution system includes an input terminal connectable to an alternating current (AC) power source and an output terminal connectable to a load. A first solid-state switching device (SSSD) and a second solid-state switching device (SSSD), each having a control terminal and two controlled terminals, are connected in series with one another between the input terminal and the output terminal. The first and second SSSDs are turned On to selectively distribute power from the AC power source to the load and turned Off to prevent the distribution of power from the AC power source to the load. A leakage current reduction circuit is connected to provide a positive bias voltage across controlled terminals of the first and second SSSD. The bias voltage is applied when the first and second SSSDs are Off to reduce the generation of leakage currents in the solid-state power distribution system.

DETAILED DESCRIPTION

The present invention provides a system and method for reducing leakage currents developed across solid-state switching devices (SSSDs) used to distribute alternating current (AC) power to a load. In particular, a leakage reduction circuit ensures a minimum voltage is maintained across controlled terminals of the SSSDs to prevent the development of leakage current that may otherwise occur during zero-crossings of the AC power. In embodiments provided below, metal-oxide semiconductor field-effect transistors (MOSFETs) are employed as the solid-state switching devices (SSSD), with the gate terminal of each MOSFET representing a control terminal of the SSSD, and the drain and source terminals representing the controlled terminals of the SSSD. A control signal provided to the control terminal (e.g., gate terminal) determines whether the SSSD is On or Off. When the SSSD is On, power is allowed to flow between the controlled terminals (e.g., between the drain and the source). When the SSSD is Off, power is prevented from flowing between the controlled terminals. In other embodiments, other types of devices may be employed such as insulated-gate bipolar transistors (IGBTs).

Figure 1:
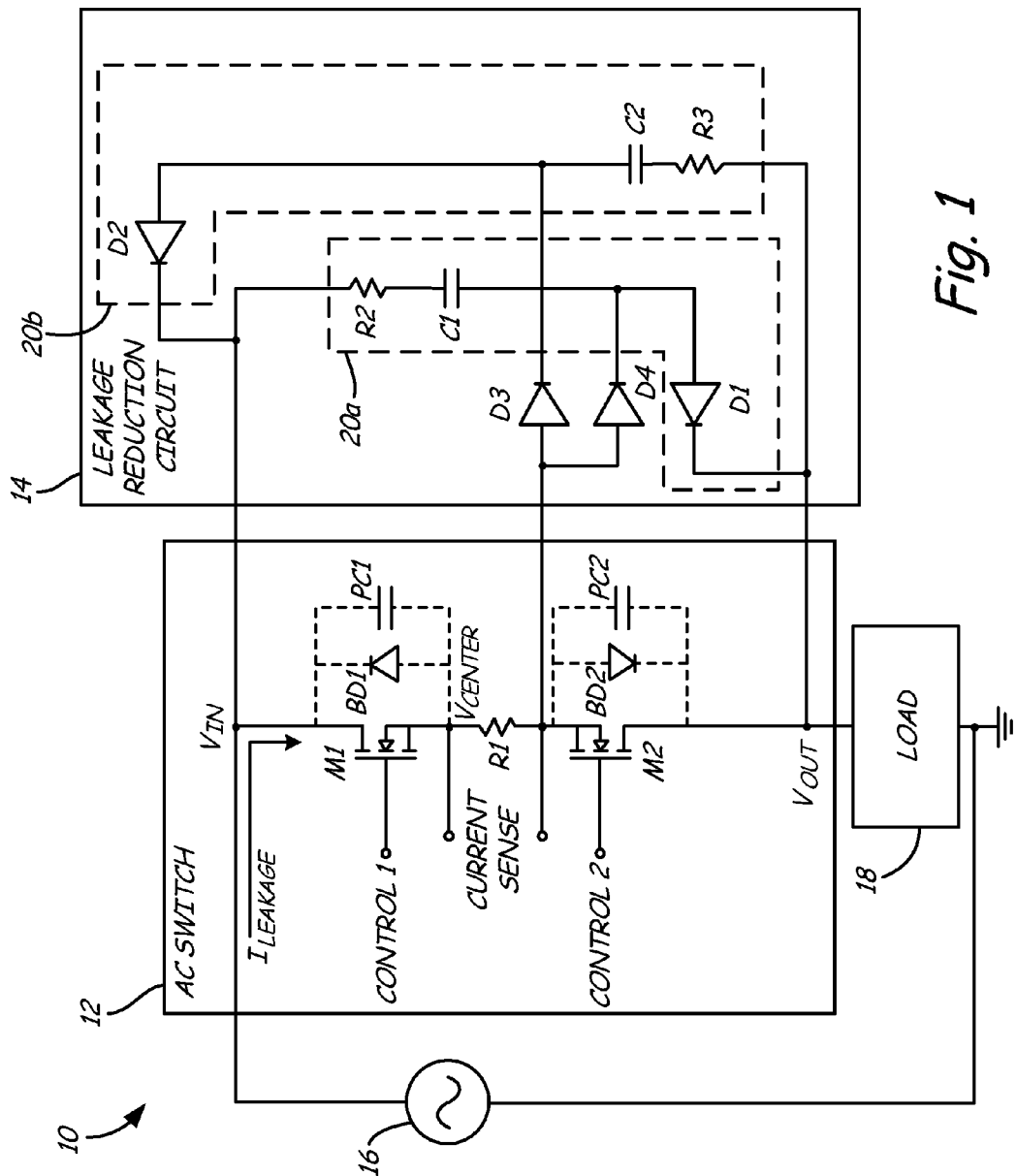
FIG. 1 is a circuit diagram of the solid-state switching device with leakage reduction circuit according to an embodiment of the present invention.

FIG. 1 is a circuit diagram of electrical power distribution system 10 that employs an alternating current (AC) switch 12 and leakage reduction circuit 14 according to an embodiment of the present invention. AC switch 12 is turned On to deliver power from AC power source 16 to load 18, and turned Off to prevent the distribution of power from AC power source 16 to load 18. Leakage reduction circuit 14 acts to limit leakage current in distribution system 10 when AC switch 12 is Off. The combination of AC switch 12 and leakage reduction circuit 14 represent a particular channel within power distribution system 10. For example, secondary power distribution systems (SPDS) employed in aircraft applications may include a plurality of channels each having their own solid-state AC switches in combination with a leakage reduction circuit.

In the embodiment shown in FIG. 1, AC switch 12 includes a pair of SSSDs M1 and M2 connected in a back-to-back configuration between input terminal Vin and output terminal Vout. A control signal provided to the control terminal (e.g., gate terminal) of each SSSD M1 and M2 dictates whether the respective SSSD is On or Off. To selectively deliver power from AC power source 16 to load 18, both SSSDs M1 and M2 are turned On. Likewise, to prevent the delivery of power from AC power source 16 to load 18, both SSSDs M1 and M2 are turned Off. Control signals (e.g., Control1, Control2) provided to the respective control terminals of SSSDs M1 and M2 are typically provided by a controller (not shown), oftentimes referred to as a solid-state power controller (SSPC). In addition to control functions, the SSPC may provide protection and test functions. For example, an SSPC monitors the current through the AC switch by monitoring the voltage across current-sense resistor R1. In response to the current increasing above a threshold value for an extended period of time, the SSPC may turn Off AC switch 12 (i.e., turns Off SSSDs M1 and M2) to prevent damage to the wires, load, and/or switching devices themselves.

Unlike mechanical contacts, SSSDs typically allow current to flow in one direction across the device even when the device is Off due to the body-diode effect between the controlled terminals of each SSSD. In AC applications, in which the waveform has a positive half-cycle and a negative half-cycle, a pair of SSSDs having opposite oriented body diodes are employed to block both portions of the AC waveform when the SSSDs are Off. For example, in the embodiment shown in FIG. 1, SSSDs M1 and M2 are N-type MOSFETs configured in the so called back-to-back configuration (source terminals connected through current sense resistor R1), having an opposite oriented body diode effect. In the embodiment shown in FIG. 1, the body diodes of SSSDs M1 and M2 are illustrated in phantom by diodes BD1 and BD2.

However, each SSSD also includes a parasitic capacitance between the controlled terminals that is charged during the respective positive and negative half-cycles of the AC power source when the SSSD is Off. In the embodiment shown in FIG. 1, the parasitic capacitances of SSSDs M1 and M2 are illustrated in phantom by capacitances PC1 and PC2. The presence of a reactive element (i.e., capacitance) between the controlled terminals allows AC signals to be communicated across the SSSDs even when Off, creating undesirable leakage current. In capacitive circuits, the current leads voltage by ninety degrees. As a result, when the sinusoidal voltage associated with the AC power source approaches a zero crossing from the positive half-cycle, a parasitic capacitance current associated with SSSD M1 approaches a negative peak value, resulting in the generation of undesirable leakage current spikes.

To prevent these leakage current spikes from occurring, leakage reduction circuit 14 biases SSSDs M1 and M2 to maintain the voltage across the controlled terminals above a certain threshold value when SSSDs M1 and M2 are Off. The bias voltage maintains the solid-state switching devices M1 and M2 within a voltage range that prevents the undesirable discharge of these parasitic capacitances. In particular, leakage reduction circuit 14 provides positive voltage biases across SSSD M1 and SSSD M2 at various points within the AC power cycle to maintain the voltage across the controlled terminals within a desired voltage range.

In the embodiment provided in FIG. 1, leakage reduction circuit 14 includes first bias circuit 20a for biasing SSSD M1 and second bias circuit 20b for biasing SSSD M2. First bias circuit 20a includes capacitor C1, resistor R2, and diode D1, and second bias circuit 20b includes capacitor C2, resistor R3, and diode D2. Additional diodes D3 and D4 are connected between the midpoint voltage node located between SSSDs M1 and M2, and respective capacitors C1 and C2. Operation of leakage reduction circuit 14 and associated bias circuits is described with respect to the scenario in which both SSSDs M1 and M2 are Off.

During a positive half-cycle of the AC power input, the positive voltage on the input bus Vin causes current to flow in the circuit path created through resistor R2, capacitor C1 and diode D1 to output bus Vout, causing capacitor C1 to charge. In the negative half-cycle, capacitor C1 provides a bias voltage across the controlled terminals of SSSD M1. The bias voltage prevents the discharge of energy from the parasitic capacitance associated with SSSD M1, thereby reducing/eliminating leakage current.

Likewise, during the negative half-cycle of the AC power input, the negative voltage on the input bus Vin causes current to flow in the circuit path created through resistor R3, capacitor C2 and diode D2, causing capacitor C2 to charge. In the positive half-cycle, capacitor C2 provides a bias voltage across the controlled terminals of SSSD M2. Once again, the bias voltage prevents the discharge of energy from the parasitic capacitance associated with SSSD M2, thereby reducing/eliminating leakage current.

Figure 2A:
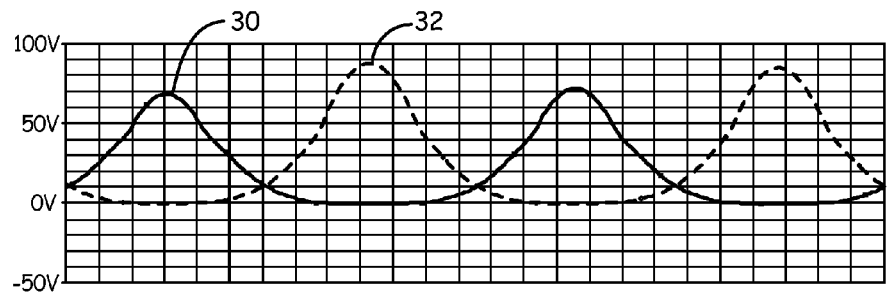
FIGS. 2A and 2B are waveform diagrams illustrating operation of the AC switch circuit without the leakage reduction circuit.
Figure 2B:
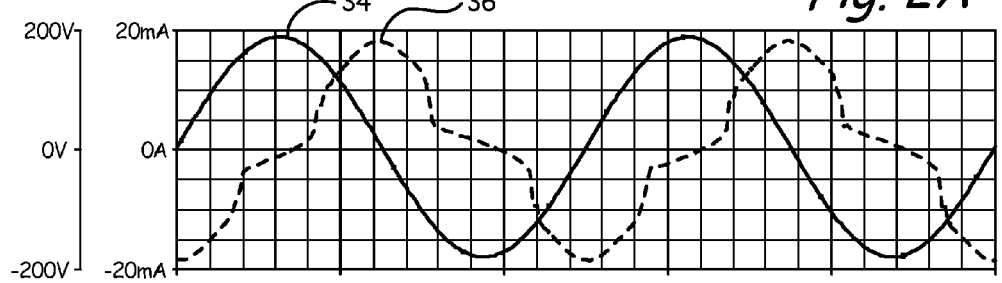

FIGS. 2A-2B and 3A-3B illustrate the ability of the present invention to reduce leakage current spikes. FIGS. 2A-2B are waveform diagrams illustrating operation of the AC switch circuit without the leakage reduction circuit as known in the prior art. In particular, FIG. 2A illustrates voltages measured between the controlled terminals of SSSD M1 (labeled '30') and the controlled terminals of SSSD M2 (labeled '32'). The voltage measured across SSSD M1 is measured between voltage node $V_{in}$, and $V_{center}$, and the voltage measured across SSSD M2 is measured between voltage node $V_{out}$ and $V_{enter}$. FIG. 2A illustrates that when both SSSDs are Off, the voltage across the controlled terminals of each SSSD equals zero during one half-cycle of the AC power input. FIG. 2B illustrates the AC voltage (labeled '34') provided by AC power source 16 and the resulting leakage current $I_{leakage}$ (labeled '36') generated in response to the AC voltage despite both SSSDs being Off.

As illustrated in FIG. 2A, the voltage across SSSDs M1 and M2 varies with the respective half-cycles of the AC voltage provided by AC power source 16. The voltage across SSSD M1 increases with the positive half-cycle of the AC voltage and decreases to near zero during the negative half-cycle of the AC voltage. Likewise, the voltage across SSSD M2 increases with the negative half-cycle of the AC voltage and decreases to near zero during the positive half-cycle of the AC voltage. As illustrated in FIG. 2B, the leakage current leads the voltage by ninety degrees, reflecting the parasitic capacitance associated with each SSSD. As the AC voltage approaches a zero-crossing, the leakage current increases to a maximum positive value (e.g., approximately eighteen milliamps). At the next zero-crossing, the leakage current decreases to a maximum negative value (e.g., approximately negative eighteen milliamps).

Figure 3A:
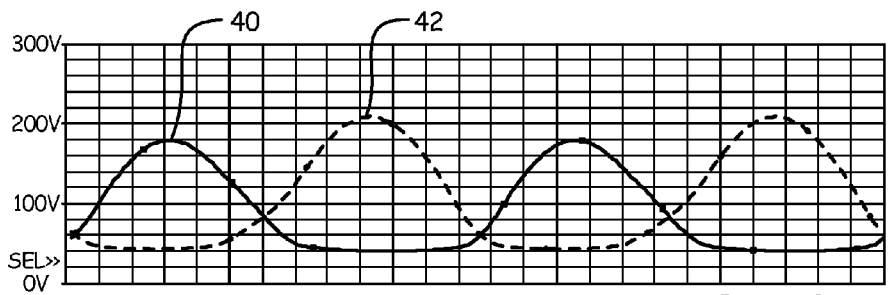
FIGS. 3A and 3B are waveform diagrams illustrating operation of the AC switch circuit with the leakage reduction circuit according to an embodiment of the present invention.
Figure 3B:
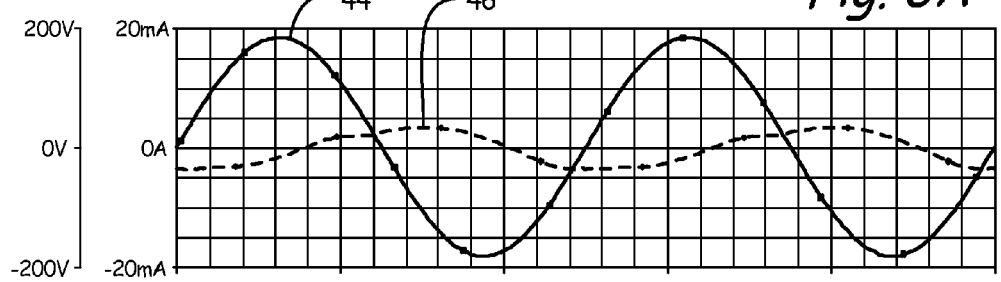

FIGS. 3A and 3B are waveform diagrams illustrating operation of the AC switch circuit with the leakage reduction circuit according to an embodiment of the present invention. FIG. 3A illustrates voltages measured between the controlled terminals of SSSD M1 (line 40) and the controlled terminals of SSSD M2 (line 42). Once again, the voltage measured across SSSD M1 is measured between voltage nodes $V_{in}$ and $V_{center}$, and the voltage measured across SSSD M2 is measured between voltage nodes $V_{out}$, and $V_{center}$. In response to the bias voltage provided by leakage reduction circuit 14, the minimum voltage across the SSSDs is maintained above zero. In the example provided in FIG. 3A, the minimum voltage is maintained above a threshold of approximately forty volts. This is in contrast with the prior art embodiment, in which the voltage across the SSSDs is allowed to decrease to nearly zero volts.

FIG. 3B illustrates how application of the bias voltage across SSSDs M1 and M2 shown in FIG. 3A limits the resulting leakage current. In particular, as compared with the embodiment shown in FIG. 2B, in which the leakage current approached approximately twenty milliamps at its peak, the embodiment of the present invention shown in FIG. 3B minimizes the leakage current to less than five milliamps. In this way, leakage current reduction circuit 14 acts to maintain the voltage across controlled terminals of the respective SSSDs at some minimum threshold value. The bias voltages across the SSSDs, in turn, limits the generation of current spikes through the AC switch.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A solid-state power distribution system comprising:
   an input terminal connectable to an alternating current (AC) power source;
   an output terminal connectable to a load;
   at least a first solid-state switching device (SSSD) and a second solid-state switching device (SSSD) connected in a series with one number between the input terminal and the output terminal, wherein the first SSSD comprises a first gate terminal and first and second controlled terminals, and wherein the second SSSD comprises a second gate terminal and third and fourth controlled terminals, and wherein the first and second SSSDs are turned On to selectively distribute power from the input terminal to the output terminal, and turned Off to selectively prevent the distribution of power from the input terminal to the output terminal; and
   a leakage current reduction circuit comprising:
      a first resistor-capacitor circuit connected to provide a first bias voltage across the first and second controlled terminals when the first SSSD is Off; and
      a second resistor-capacitor circuit connected to provide a second bias voltage across the third and fourth controlled terminals when the second SSSD is Off.

2. The solid-state power distribution system of claim 1, wherein the first resistor-capacitor circuit includes a first capacitor connected to the input terminal to charge during a positive half-cycle of the AC power source and to discharge to provide the first bias voltage to the first SSSD during the negative half-cycle of the AC power.

3. The solid-state power distribution system of claim 2, wherein the first resistor-capacitor circuit includes a first resistor and a first diode connected to the first capacitor to form a current path between the input terminal and the output terminal during positive half-cycles of the AC power source to charge the first capacitor.

4. The solid-state power distribution system of claim 1, wherein the second resistor-capacitor circuit includes a second capacitor connected to the input terminal to charge during a negative half-cycle of the AC power source and to provide the second bias voltage to the second SSSD during the positive half-cycle of the AC power source.

5. The solid-state power distribution system of claim 4, wherein the second resistor-capacitor circuit includes a second resistor and a second diode connected to the second capacitor to form a current path between the input terminal and the output terminal during negative half-cycles of the AC power source to charge the second capacitor.

6. A method of reducing leakage current in an alternating current (AC) switch that includes a first solid-state switching device (SSSD) and a second solid-state switching device connected between an input terminal for receiving AC power from an AC power source and an output terminal for providing the AC power to a load, the method comprising:
   providing, using a first resistor-capacitor circuit, a first bias voltage across first and second controlled terminals of the first SSSD to maintain the voltage across the first and second controlled terminals above a first positive threshold value when the first SSSD is Off; and
   providing, using a second resistor-capacitor circuit, a second bias voltage across third and fourth controlled terminals of the second SSSD to maintain the voltage across the third and fourth controlled terminals below a second positive threshold value when the second SSSD is Off.

7. The method of claim 6, wherein providing a first bias voltage includes:
   charging a first capacitor of the first resistor-capacitor circuit during a positive half-cycle of the AC power source connected to the input terminal; and
   discharging the first capacitor across the first and second controlled terminals of the first SSSD during a negative half-cycle of the AC power source.

8. The method of claim 6, wherein providing a second bias voltage includes:
   charging a second capacitor of the second resistor-capacitor circuit during a negative half-cycle of the AC power source connected to the input terminal; and
   discharging the second capacitor across the third and fourth controlled terminals of the second SSSD during a positive half-cycle of the AC power source.

* * * * *